United States Patent
Kasai

(10) Patent No.: US 7,430,985 B2
(45) Date of Patent: Oct. 7, 2008

(54) PLASMA PROCESSING EQUIPMENT

(75) Inventor: Shigeru Kasai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/502,807

(22) PCT Filed: Jan. 27, 2003

(86) PCT No.: PCT/JP03/00739

§ 371 (c)(1),
(2), (4) Date: Aug. 6, 2004

(87) PCT Pub. No.: WO03/067939

PCT Pub. Date: Aug. 14, 2003

(65) Prior Publication Data

US 2005/0082004 A1    Apr. 21, 2005

(30) Foreign Application Priority Data

Feb. 6, 2002   (JP)   ............................. 2002-029947

(51) Int. Cl.
C23C 16/00   (2006.01)
C23F 1/00    (2006.01)
H01L 21/306  (2006.01)

(52) U.S. Cl. .................... 118/723 MW; 118/723 MA; 118/723 MR; 156/345.36; 156/345.41; 156/345.42; 156/345.46

(58) Field of Classification Search ......... 118/723 MW, 118/723 MA, 723 MR; 156/345.36, 345.41
See application file for complete search history.

(56) References Cited

U.S. PATENT DOCUMENTS

| | | | |
|---|---|---|---|
| 3,078,428 A | 2/1963 | Miller | |
| 4,216,449 A * | 8/1980 | Kach | 333/236 |
| 4,441,091 A | 4/1984 | Nishida et al. | |
| 5,523,652 A * | 6/1996 | Sferlazzo et al. | 315/111.41 |
| 5,830,591 A * | 11/1998 | Sengupta et al. | 428/701 |
| 6,109,208 A | 8/2000 | Tsuchihashi et al. | |
| 6,329,957 B1 * | 12/2001 | Shea et al. | 343/756 |
| 6,401,653 B1 * | 6/2002 | Taniguchi et al. | 118/723 MW |
| 6,656,322 B2 * | 12/2003 | Hongo et al. | 156/345.41 |

(Continued)

FOREIGN PATENT DOCUMENTS

JP    58-221501    12/1983

(Continued)

*Primary Examiner*—Parviz Hassanzadeh
*Assistant Examiner*—Rakesh K Dhingra
(74) *Attorney, Agent, or Firm*—Oblon, Spivak, McClelland, Maier & Neustadt, P.C.

(57) ABSTRACT

Plasma processing equipment capable of increasing the heat resistance of a wave guide by using a high dielectric material, comprising a processing container 44 formed to allow vacuuming, a loading table 46 installed in the processing container for placing a processed body W thereon, a microwave transmission plate 72 installed in an opening part at the ceiling of the processing container, a flat antenna member 76 for feeding microwave into the processing container through the microwave transmission plate, a shield cover body 80 earthed so as to cover the upper part of the flat antenna member, and a waveguide 90 for feeding the microwave from a microwave generating source to the flat antenna member, characterized in that the waveguide is formed of a high dielectric waveguide 94 using the high dielectric material, whereby the heat resistance of the waveguide can be increased.

19 Claims, 11 Drawing Sheets

U.S. PATENT DOCUMENTS

| | | | |
|---|---|---|---|
| 6,683,517 B2 * | 1/2004 | Chiu et al. | 333/243 |
| 2002/0011802 A1 * | 1/2002 | Espiau et al. | 315/246 |
| 2003/0122633 A1 * | 7/2003 | Tsironis | 333/17.3 |

FOREIGN PATENT DOCUMENTS

| | | |
|---|---|---|
| JP | 7-220897 | 8/1995 |
| JP | 9-92492 | 4/1997 |
| JP | 11-204296 | 7/1999 |
| JP | 2001-274150 | 10/2001 |
| JP | 2002-231637 | 8/2002 |
| JP | 2003-109797 | 4/2003 |

* cited by examiner

<FIRST MODIFICATION>

<SECOND MODIFICATION>

PLASMA PROCESSING EQUIPMENT

FIELD OF THE INVENTION

The present invention relates to a plasma processing apparatus for processing a semiconductor wafer or the like by subjecting it to a plasma produced by microwave.

BACKGROUND OF THE INVENTION

Recently, in conjunction with the trend of high packing density and high miniaturization of semiconductor devices, a plasma processing apparatus is employed to perform, such as film forming, etching, and ashing processes in manufacturing semiconductor devices. In particular, given that the apparatus is capable of generating plasma under stable condition even in a high vacuum state at a relatively low pressure in the range of 0.1 to several tens of mTorr, a plasma processing apparatus that processes a wafer by subjecting it to a high-density plasma generated by microwave tends to be used.

Such plasma processing apparatus is disclosed in Japanese Patent Laid-Open Application No. 1-184923, 3-191073, 5-343334 or Japanese Patent Laid-Open Application No. 9-181502 filed by the assignee of the present invention. Here, a typical plasma processing apparatus using microwave is schematically explained with reference to FIG. 11, which illustrates a typical prior art plasma processing apparatus.

As shown in FIG. 11, the plasma processing equipment 2 includes a loading table 6, disposed in a processing container 4 which can be vacuum pumped, for mounting thereon a semiconductor wafer W; in a ceiling portion facing the loading table 6, a microwave transmission window 8 for transmitting microwave, which is made of, e.g., aluminum nitride in disk form, is installed airtight. Specifically, the microwave transmission window 8 is mounted hermetically via a sealing member 14 such as an O-ring or the like on a supporting bracket 12 which protrudes radially inward from a ring-shaped supporting frame member 10 made of, e.g., aluminum, wherein the frame member is installed at an upper portion of the processing container 4.

In addition, disposed on the top surface of the microwave transmission window 8 are, a disc-shaped flat antenna member 16 several mm thick and if necessary, a wave delay member 18 made of, e.g., dielectric material for shortening the wavelength of microwave in the radial direction of the flat antenna member 16. A shield cover body 20 made of a conductor material is provided so as to cover the flat antenna member 16 and the wave delay member 18 while closing the top portion of the processing container 4. Further, installed above the wave delay member 18 is a ceiling cooling jacket 24 with cooling water channels 22 through which cooling water runs to cool the shield cover body 20, and so forth. Moreover, in the antenna member 16, microwave emission holes 26 composed of substantially circular or slit-shaped penetration holes, are formed. In addition, connected to the central portion of the flat antenna member 16 is an internal conductor 30 of a coaxial waveguide 28. A rectangular waveguide 34 is connected to the coaxial waveguide 28 via a mode converter 32 and after that, at the same time, the rectangular waveguide 34 is connected to a matching circuit 36, an isolator 38 and a microwave generating source 40. The matching circuit 36 is adapted to the TE mode among vibration modes of microwave. As a result of this, microwave of, e.g., 2.45 GHZ in the TE mode, which is generated from the microwave generating source 40, is transmitted to the matching circuit 36 and the mode converter 32 through the rectangular waveguide 34. Thereafter, the TE mode of microwave is converted into the TEM mode by the mode converter 32, and the converted microwave is introduced (induced) into the antenna member 16 through the coaxial waveguide 28. Further, microwave in the TEM mode is then propagated in the radial direction of the antenna member 16 and is emitted from the microwave emission holes 26 provided in the antenna member 16 while emitted microwave is transmitted through the microwave transmission window 8. Microwave is then introduced into the processing container 4 disposed in the lower part of the plasma processing equipment; this microwave is used to generate a plasma in the processing container 4, thereby carrying out a plasma process such as etching, film forming, ashing or the like on a semiconductor wafer W.

However, with regard to plasma processing equipment such as above, in the rectangular waveguide 34 or the coaxial waveguide 28, discontinuities are formed at the junctions where they connect with another component member, e.g., the mode converter 32 or the antenna member 16. Consequently, multiple reflections of microwave or the like occur in such discontinuities, inevitably resulting in heat production due to the Joule heat generated from line resistance. In such a case, since the coaxial waveguide 28 or the internal conductor 30 therein is made of a conductor formed of, e.g., brass whose surface is silver-plated, its linear expansion coefficient is relatively large and is about $17.2 \times 10^{-6}/°$ C. As a result, the coaxial waveguide 28 is deformed by thermal expansion, thereby causing a deformation or a defect in the junctions and, further, a leakage of microwave.

Further, another problem exists as follows. Such a plasma processing apparatus 2 introduces microwave in the TEM mode into the processing container 4. This is because the direction of electromagnetic waves' pointing vector coincides with the direction of current flow. Thus, the antenna can be designed by only considering the phase of the current. However, since a TE-mode matching circuit 36 has been widely utilized in the past, the TE-mode matching circuit 36 has been used in the plasma processing apparatus 2 customarily; and a mode converter 32 for converting the TE mode of microwave into the TEM mode is put in place on the transmission lane of microwave to supply the converted microwave to the flat antenna member 16.

Accordingly, since the mode converter 32 is required, the cost of the plasma processing apparatus increases while the conversion loss of microwave also occurs.

Moreover, since the matching circuit 36 is for the TE mode, it needs to be disposed upstream of the mode converter 32. As a result, the matching circuit 36 must be usually disposed at a site far from the flat antenna member 16 where characteristic impedance would vary substantially, making it impossible to carry out a matching operation of impedance efficiently on occasion.

SUMMARY OF THE INVENTION

The present invention has been conceived in order to solve effectively the aforementioned problematic issues.

A first object of the present invention is to provide a plasma processing apparatus capable of increasing the heat resistance of a waveguide by using a high dielectric material.

A second object of the present invention is to provide a plasma processing apparatus which would no longer require, e.g., a conventional matching circuit corresponding to the TE mode, by using a slug matcher corresponding to the TEM mode, wherein the matcher can be installed adjacent to a flat antenna member at the same time.

In accordance with a first preferred embodiment of the present invention, there is provided a plasma processing equipment including: an evacuatable processing container; a loading table, installed in the processing container, for loading thereon an object to be processed; a microwave transmission plate provided in an opening of a ceiling of the processing container; a flat antenna member for supplying microwave into the processing container via the microwave transmission plate; a grounded shield cover body covering an upper side of the flat antenna member; and a waveguide for supplying the microwave from a microwave generating source to the flat antenna member, wherein the waveguide includes a high dielectric waveguide made of a high dielectric material.

As above, by employing the high dielectric waveguide made of a high dielectric material, the linear expansion coefficient of the waveguide itself becomes smaller than that of a conventional waveguide made of a conductor material. Therefore, its thermal deformation is reduced, resulting in an improvement of heat resistance thereof. Accordingly, the deformation of the waveguide or the leakage of microwave can be prevented.

Further, for example, a mode converter is interposed in the waveguide, and the high dielectric waveguide is employed between the mode converter and the flat antenna member.

Furthermore, for example, the high dielectric waveguide includes a tube-shaped waveguide main body and a guide axis inserted through the waveguide main body, and wherein at least one of the waveguide main body and the guide axis is formed of the high dielectric material.

In addition, the high dielectric material has a relative dielectric constant greater than or equal to 1000.

Moreover, for example, the high dielectric material includes one or more materials selected from the group consisting of PZT (complex materials containing Pb, Zr, Ti and O), BST (complex materials containing Ba, Sr, Ti and O) and SBT (complex materials containing Sr, Bi, Ta and O).

Further, for example, the flat antenna member is provided with microwave radiation holes formed of through holes arranged in a concentric or a spiral shape.

Still further, for example, the flat antenna member is provided with plural pairs of radiation holes formed in a concentric or a spiral shape, each pair of radiation holes being of two adjacent microwave radiation holes formed of through holes disposed in directions differing from each other by about 90 degrees.

Besides, for example, the waveguide is provided with a slug matcher using a dielectric material.

In accordance with a second preferred embodiment of the present invention, there is provided a plasma processing equipment including: an evacuatable processing container; a loading table, installed in the processing container, for loading thereon an object to be processed; a microwave transmission plate provided in an opening of a ceiling of the processing container; a flat antenna member for supplying microwave into the processing container via the microwave transmission plate; a grounded shield cover body covering an upper side of the flat antenna member; and a waveguide for supplying the microwave from a microwave generating source to the flat antenna member, wherein a slug matcher using a dielectric material is interposed in the waveguide.

As above, by disposing the slug matcher formed of a dielectric material, a TE mode matching circuit, which has been employed in the past, would no longer be necessary.

Further, for example, the slug matcher is disposed close to the flat antenna member.

As a result of this, the TEM mode slug matcher can be disposed adjacent to the flat antenna member so that an improvement of efficiency in impedance matching can be achieved.

Moreover, for example, the slug matcher includes two matching members which are made of a dielectric material and are appropriately spaced apart from each other along a propagation direction of the microwave, and wherein the two matching members are capable of being moved as a unit and also individually along the propagation direction of the microwave.

In addition, for example, the waveguide is a coaxial waveguide, and the microwave is propagated in a vibration mode of a TEM mode from the microwave generating source.

As a result of this, since microwave can be propagated in the TEM mode from the microwave generating source, a mode converter is no longer necessary, thereby contributing to a cost saving and eliminating mode conversion losses.

Further, for example, a mode converter is interposed in the waveguide, and the slug matcher is installed at a portion of the waveguide connecting the mode converter and the flat antenna member.

DETAILED DESCRIPTION OF PREFERRED EMBODIMENTS

Hereinafter, a plasma processing apparatus in accordance with a first preferred embodiment of the present invention is described in detail with reference to the accompanying drawings.

First, a first preferred embodiment of the present invention is discussed.

Figure 1:
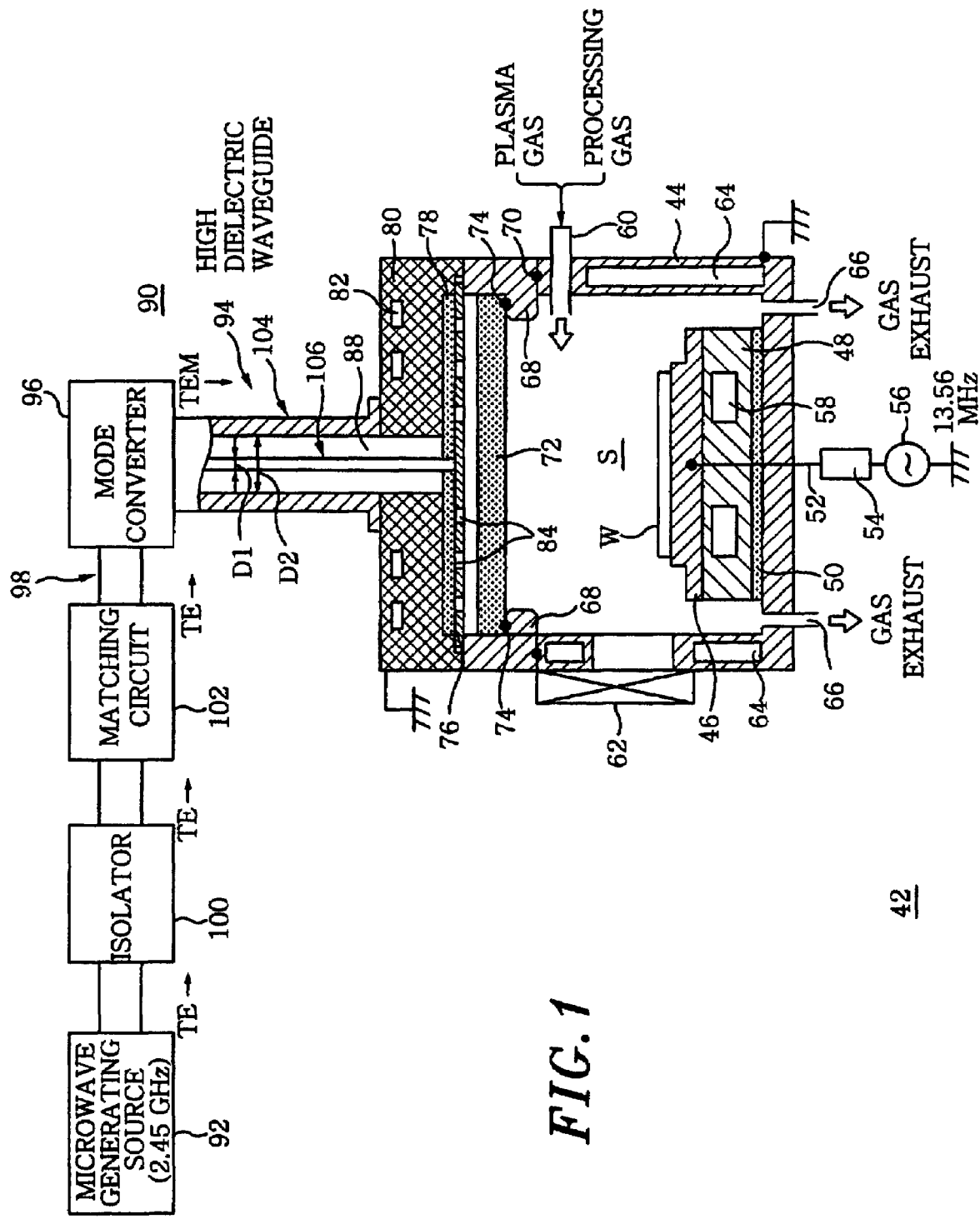
FIG. 1 shows a plasma processing apparatus in accordance with a first preferred embodiment of the present invention.
Figure 2A:
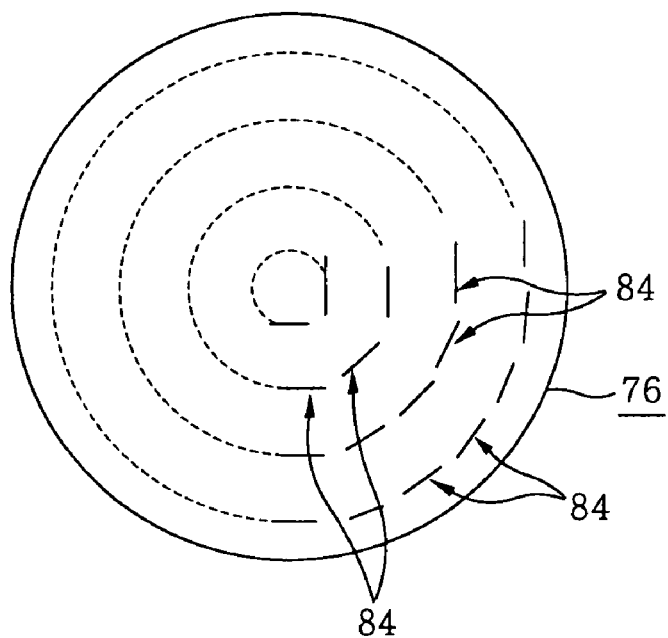
FIGS. 2A and 2B are a plan view of an example of a flat antenna member.
Figure 2B:
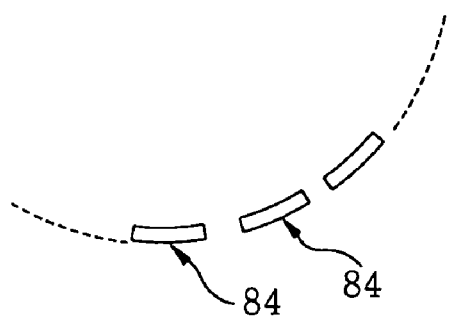
Figure 3A:
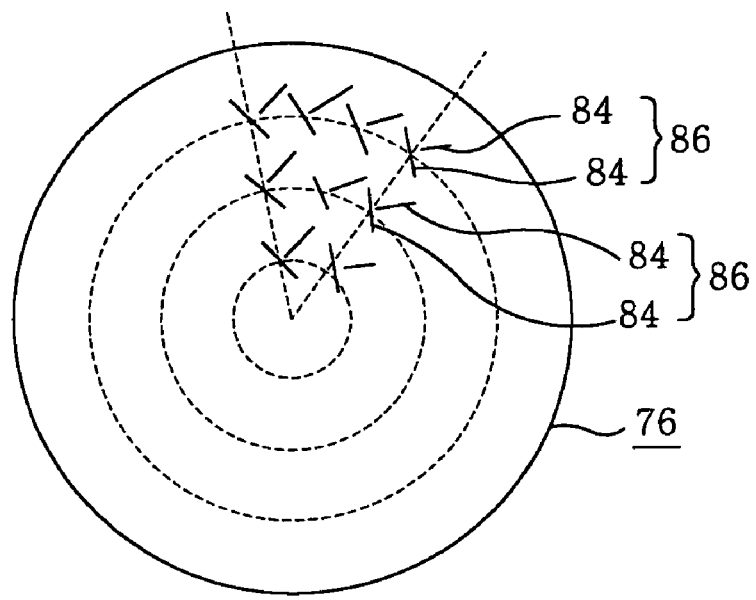
FIGS. 3A and 3B illustrate a plan view showing another example of the flat antenna member.
Figure 3B:
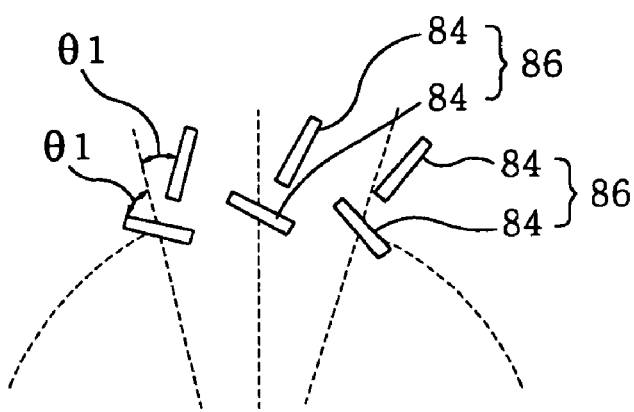
Figure 4:
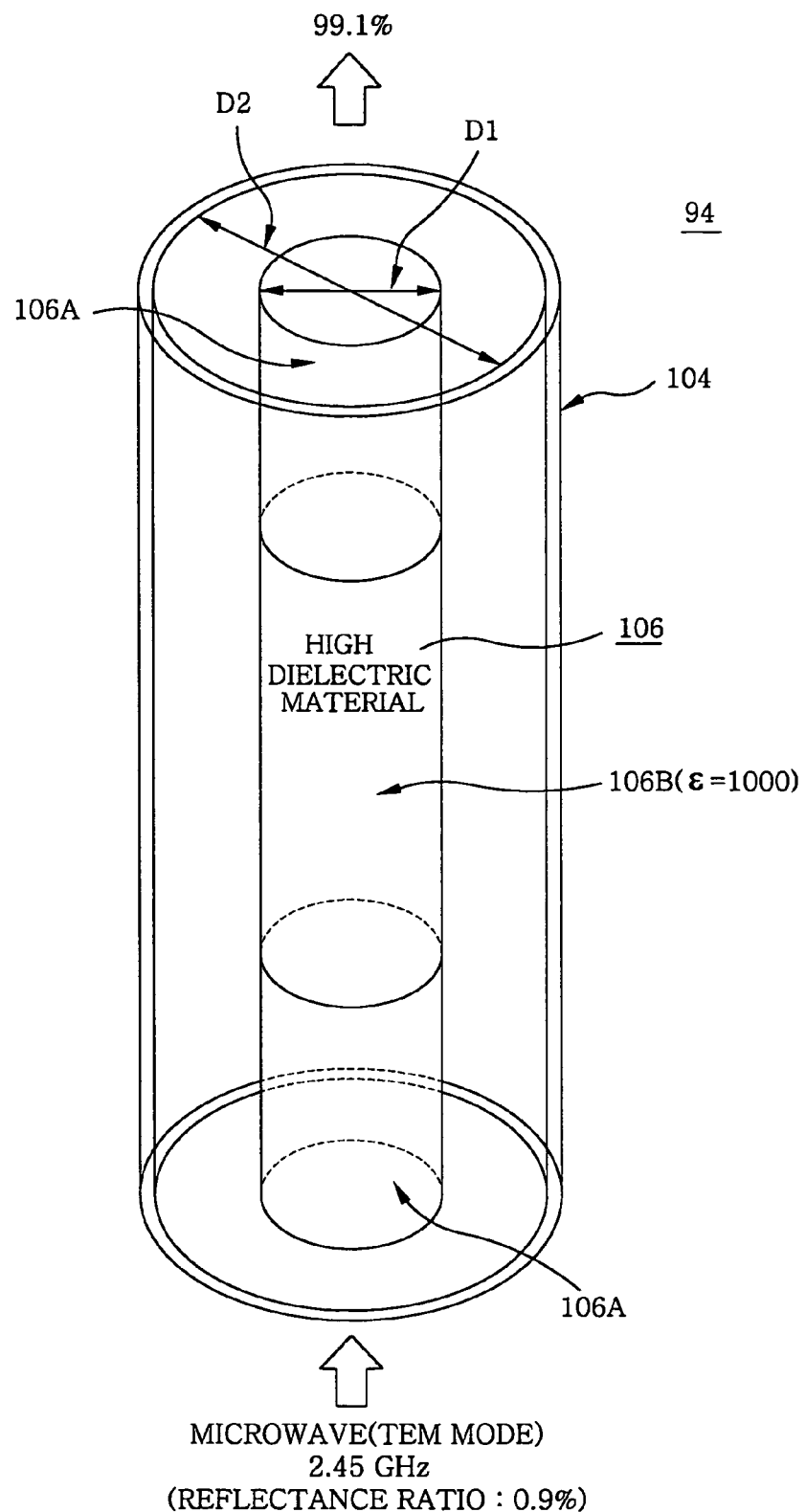
FIG. 4 illustrates a simulation model of microwave transmission in a high dielectric waveguide used in the first embodiment of the present invention.
Figure 6:
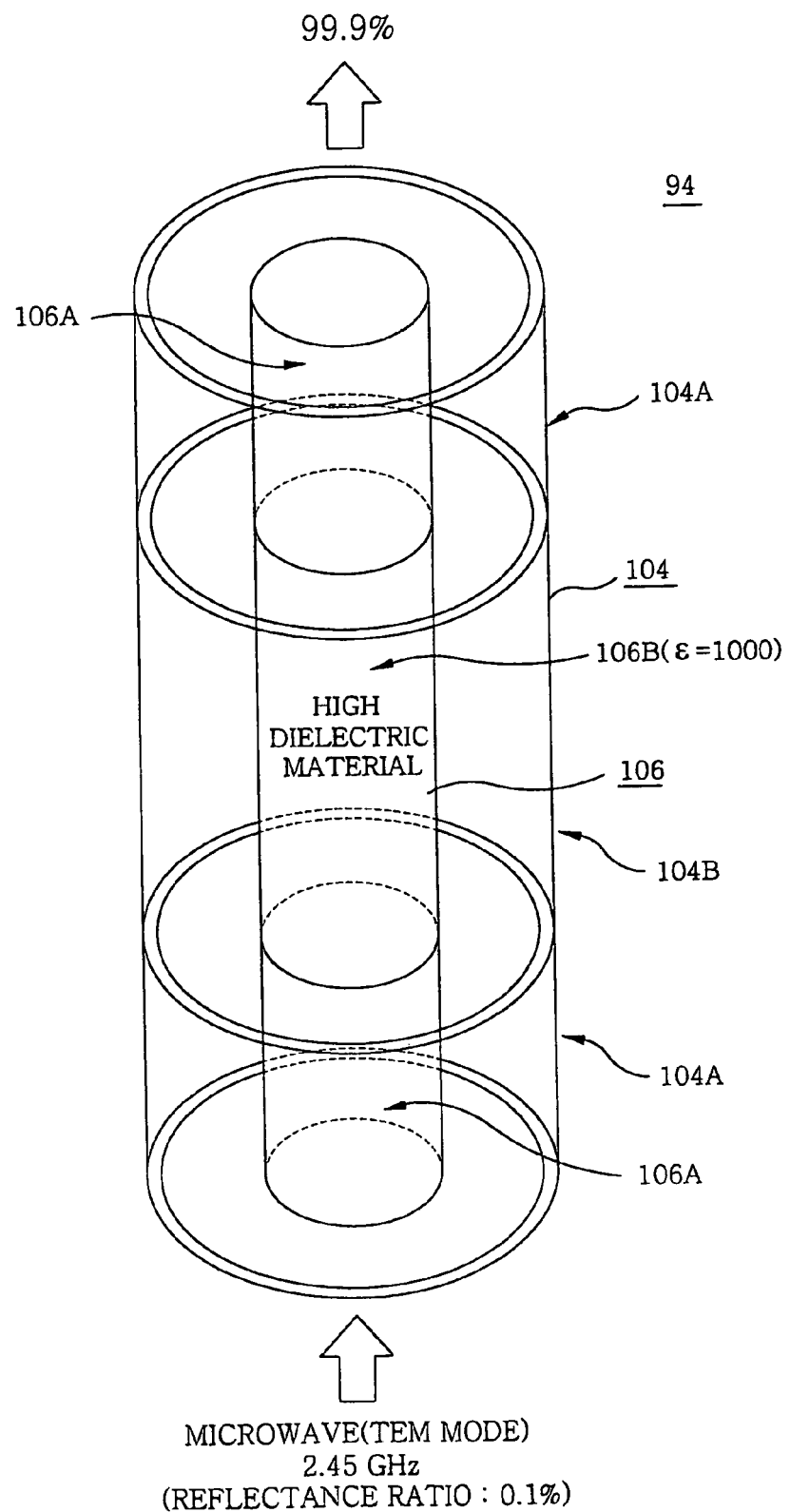
FIG. 6 illustrates a simulation model of microwave transmission in another type of high dielectric waveguide.

FIG. 1 illustrates the configuration of a plasma processing apparatus in accordance with the first embodiment and FIGS. 2A and 2B are a plan view illustrating an example of a flat antenna member employed in the apparatus. FIGS. 3A and 3B show a plan view of another example of the flat antenna member and FIG. 4 shows a simulation model of microwave transmission in a high dielectric waveguide used in the first embodiment. FIG. 6 illustrates a simulation model of microwave transmission in another type of high dielectric waveguide. In the present invention, a high dielectric material refers to a dielectric material having a relative dielectric constant higher than that of a typical dielectric material, for example, greater than or equal to 100, or preferably, greater than or equal to 1000. Further, in the present invention, a ferroelectric material can be used as a high dielectric material provided its relative dielectric constant is greater than or equal to 100.

As shown in the diagrams, the plasma processing apparatus 42 is composed of an entirely cylindrical processing container 44 whose, e.g., sidewall or bottom portions are formed of a conductor such as aluminum. The processing container 44 is grounded, and its inside space is made up of a hermetically sealed space S.

In the processing container 44, a loading table 46 is disposed for mounting on its top surface an object to be processed, for example, a semiconductor wafer W. The loading table 46 is formed of, for example, alumite treated aluminum, which has the shape of a substantially circular column, which protrudes upward with a flat surface. The lower portion of the loading table 46 is supported by a cylindrical support 48 made of, e.g., aluminum, and the support 48 is installed in the bottom portion of the processing container 44 via an insulating member 50.

On the top surface of the loading table 46, an electrostatic chuck or a clamp mechanism (not shown) for holding the wafer thereon is provided. The loading table 46 is connected to a high frequency bias power supply 56 of, e.g., 13.56 MHz, by a feeder line 52 via a matching box 54. Further, there are cases in which the high frequency bias power supply 56 is not installed. Even if the high frequency bias power supply 56 is not provided, upon obtaining a bias electrode, by having it grounded or in an electrically floated state, it is possible to enhance the plasma ignition efficiency.

Within the support 48 for supporting the loading table 46, a cooling jacket 58, for letting cooling water to flow therethrough to cool the wafer during plasma processing, is disposed. Further, if necessary, inside the loading table 46, a heater may be disposed.

On the sidewall of the processing container 44, as a gas supplying means, a supply nozzle 60 made of, e.g., a quartz pipe, for introducing a plasma gas such Ar gas or, a processing gas such as deposition gas, is provided. The plasma gas and the processing gas are supplied through the nozzle 60 at controlled flow rates. As for the examples of deposition gas as a processing gas, when film forming such as silicon nitride film, $SiH_4$ gas, $O_2$ gas, $N_2$ gas or the like can be used.

Further, on the sidewall of the container, a gate valve 62 which is opened/closed for loading/unloading the wafer is disposed and at the same time, and a cooling jacket 64 also for cooling the sidewall. Moreover, at the bottom portion of the container, a gas exhaust port 66 connected to a vacuum pump (not shown) is provided, so that the inside of the processing container 44 can be vacuum pumped to a predetermined pressure level when necessary.

In addition, the ceiling portion of the processing container 44 is exposed to form an opening. Along the periphery of the opening, a circular ring-shaped supporting frame member 68 is provided via a sealing member 70 such as O-ring or the like. Installed airtight on the supporting frame member 68 via a sealing member 74 such as an O-ring is a microwave transmission plate 72 made of a dielectric material, e.g., ceramic material such as AlN with a thickness of 20 mm, the microwave transmission plate 72 being transparent to microwave, whereby the inside of the processing container 44 is kept sealed airtight.

Further, provided above the microwave transmission plate 72 is a disc-shaped flat antenna member 76 whose peripheral portion is supported to be mounted on the top portion of the supporting frame member 68. Installed on a top surface of the antenna member 76 is a disc-shaped wave delay member 78 with a high relative dielectric constant. A lid-shaped shield cover body 80 is provided to cover the upper portion of both the antenna member 76 and the wave delay member 78, and the bottom portion of the shield cover body 80 is supported by a top portion of the supporting frame member 68. Inside the shield cover body 80, a cooling water channel 82 is formed for running a cooling water therethrough, thereby cooling the shield cover body 80 or the wave delay member 78, and so fourth. Further, the shield cover body 80 is grounded. Moreover, the flat antenna member 76 is disposed to face the loading table 46 in the processing container 44.

When the flat antenna member 76 is used for a wafer having a diameter of, e.g., 8 inches, it is made of a circular conductive plate, e.g., an aluminum plate or a copper plate whose surface is silver-plated, which has a diameter ranging from 300 to 400 mm and a thickness ranging from 1 to several mm, e.g., 5 mm. Further, the circular plate is provided with a plurality of microwave emission holes 84 arranged in a concentric or a spiral shape, each being formed of, e.g., a long slit-shaped or a circular penetration hole.

Specifically, the microwave radiation holes 84 are formed in the flat antenna member 76 as shown in FIGS. 2A and 2B or FIGS. 3A and 3B. In FIGS. 2A and 2B, the plurality of microwave radiation holes 84 are formed of thin and long slit-shaped penetration holes (see FIG. 2B) and the microwave radiation holes 84 are arranged concentrically as shown in FIG. 2A. The length of each microwave radiation hole 84 is, for example, about $\lambda/4$, $\lambda$ referring to the wavelength of microwave used herein in the wave delay member 78.

Further, in FIGS. 3A and 3B, pairs 86 of microwave radiation holes are formed (see FIG. 3B), wherein the two adjacent microwave radiation holes 84 each having the above-described shape in each pair are substantially at a right angle to each other. A plurality of pairs 86 of the microwave radiation holes is concentrically arranged as shown in FIG. 3A. In such a case, the direction of each microwave radiation hole 84 in pairs 86 of the microwave radiation holes is set to be at a predetermined angle θ1, e.g., +45 degrees or −45 degrees with respect to a radial direction of the flat antenna member 76. Further, the shape of each microwave radiations hole 84 is not limited to the long and thin slit-shape. For example, they can be circular, ellipse or the like.

Referring back to FIG. 1, formed at a central top portion of the shield cover body 80 is an opening 88. A waveguide 90, an inventive feature of the present invention, is connected to the opening 88, and a microwave generating source 92 for generating microwave of, e.g., 2.45 GHz, is connected to an end portion of the waveguide 90. Accordingly, the microwave generated from the microwave generating source 92 can be propagated to the flat antenna member 76 via the waveguide 90. Further, the frequency of the microwave can also be set at 8.35 GHz, 1.98 GHz, and so forth.

To be specific, the waveguide 90 has a high dielectric waveguide 94 with a circular cross section and a rectangular waveguide 98 with a rectangular cross section, wherein the high dielectric waveguide 94 is directly fixed to the central opening 88 of the shield cover body 80 in such a manner as to stand upright while the rectangular waveguide 98 is horizontally connected to an upper end portion of the high dielectric waveguide 94 via a mode converter 96 for converting a vibration mode of the microwave.

The rectangular waveguide 98 connecting the microwave generating source 92 and the mode converter 96 is entirely made of a conductor material, e.g., brass whose surface is silver-plated, to have a rectangular cross section. An isolator 100 for performing isolation against a reflected wave of the microwave and the TE mode matching circuit 102 for performing an impedance matching for a transmission of the microwave are connected between the microwave generating source 92 and the mode converter 96 in that order in the rectangular waveguide 98. Further, the matching circuit 102 includes a stab tuner formed of a combination of, e.g., metal pins. Accordingly, the microwave generated from the microwave generating source 92 travels through the rectangular waveguide 98 with its vibration mode set as the TE mode.

Meanwhile, the high dielectric waveguide 94 connecting the mode converter 96 and the flat antenna member 76 is formed of a material including a high dielectric substance. Specifically, the high dielectric waveguide 94 for transmitting microwave in the TEM mode includes a tube-shaped or a pipe-shaped waveguide main body 104 with a substantially circular ring-shaped cross section and a guide axis 106 inserted through a central portion of the waveguide main body 104.

Herein, the diameter D1 of the guide axis 106 is, for example, about 3 mm. Further, the inner diameter D2 and the thickness of the waveguide main body 104 are, for example, about 10 mm and about 0.3 mm, respectively. However, it should be noted that these dimensions are just for examples and, thus, can be changed preferably depending on the characteristic impedance of microwave transmission paths located before or after them.

Besides, at least any one of the guide axis 106 and the waveguide main body 104 is formed of a high dielectric material, e.g., ceramics. That is to say, either one of the guide axis 106 and the waveguide main body 104 or both of them may be formed of the high dielectric material. In case the guide axis 106 is formed of the high dielectric material, a bottom end portion thereof may be connected to the flat antenna member 76 by, e.g., a screw or by spraying a metal.

A substance having a relative dielectric constant equal to or greater than 1000 is preferably used as the high dielectric material in order to improve the propagation efficiency of microwave. For instance, the substance can be for example at least one selected from the group consisting of, e.g, PZT (complex material containing Pb, Zr, Ti and O), BST (complex material containing Ba, Sr, Ti and O) and SBT (complex material containing Sr, Bi, Ta and O).

Further, since the linear expansion coefficient, e.g., $1.02 \times 10^{-6}/°$ C., of the high dielectric material is about ten times smaller than that of a metal material typically employed to form a coaxial waveguide in a prior art apparatus, the degree of thermal distortion becomes small as well. The high dielectric waveguide 94 using such a high dielectric material functions to guide the microwave as will be described later, thereby contributing to the efficient propagation of the microwave.

Now, a processing method performed by using the plasma processing apparatus configured as described above will be discussed.

First, a semiconductor wafer W is loaded into the processing container 44 by a transfer arm (not shown) through the gate valve 62. Then, by moving a lifter pin (not shown) vertically, the wafer W is mounted on the mounting surface which is the top surface of the loading table 46.

Then, the inside of the processing container 44 is maintained at a predetermined processing pressure, and, e.g., Ar gas or a deposition gas such as $SiH_4$ gas, $O_2$ gas and $N_2$ gas is supplied thereinto from the gas supply nozzle 60 at controlled flow rates. At the same time, microwave is supplied from the microwave generating source 92 to the flat antenna member 76 sequentially via the rectangular waveguide 98, the mode converter 96 and the high electric waveguide 94, so that microwave with a wavelength shortened by the wave delay member 78 is introduced into the processing space S, thereby generating a plasma to perform a certain plasma process, e.g., film forming process by a plasma CVD.

Here, the microwave generated from the microwave generating source 92 is propagated as the TE mode within the rectangular waveguide 98. The TE mode of the microwave is converted into the TEM mode by the mode converter 96 such that the microwave may travel as the TEM mode within the high dielectric waveguide 94 having a circular ring-shaped cross section toward the flat antenna member 76.

A reflected wave of the microwave can be generated inside the waveguide 90 due to various factors such as the plasma state or the pressure state in the processing space S. The matching circuit 102 operates so as to minimize the reflection wave, thereby performing so-called, a matching function.

Further, a propagation loss of the microwave or a dielectric loss of the high dielectric material can occur at joints where the high dielectric waveguide 94 connect with the mode converter 96 and/or the flat antenna member 76, resulting in a rise in temperature of the waveguide 90 itself. Since, however, the linear expansion coefficient of the high dielectric material forming the waveguide 90 is small, the degree of thermal distortion of the waveguide 90 will be very small, thereby increasing its heat resistance.

Moreover, since the amount of thermal distortion is small as mentioned, a leakage of microwave, for example, can be prevented.

The result of a simulation, which has been performed for the transmission of microwave through the high dielectric waveguide 94 will be discussed hereinafter.

Figure 5A:
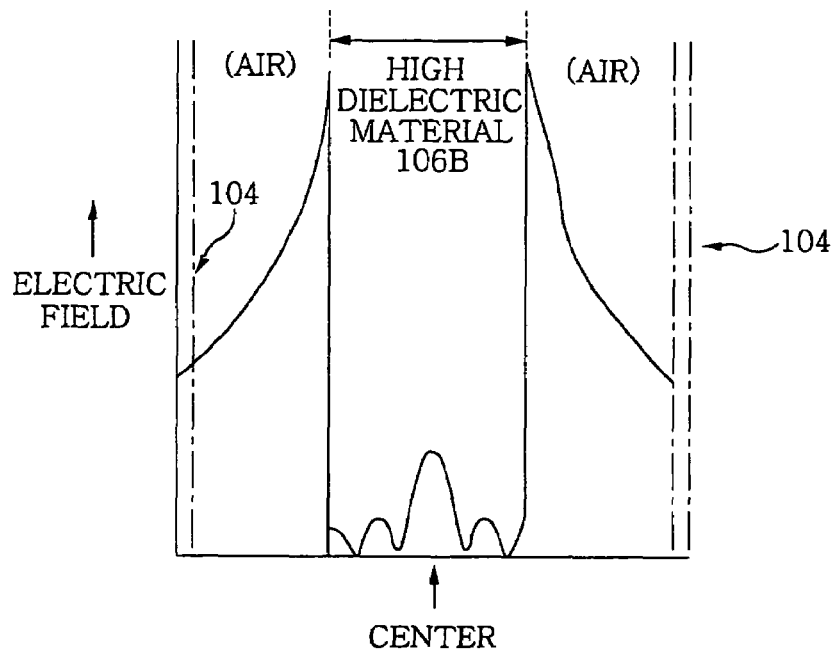
FIGS. 5A to 5C are the plots of a simulation result of microwave transmission in the high dielectric waveguide in FIG. 4.
Figure 5B:
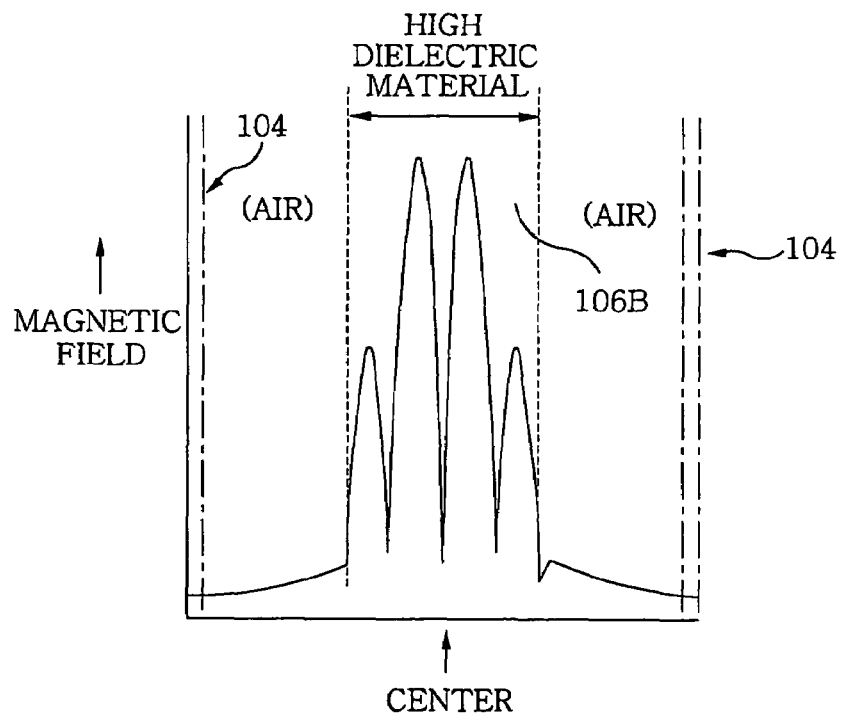
Figure 5C:
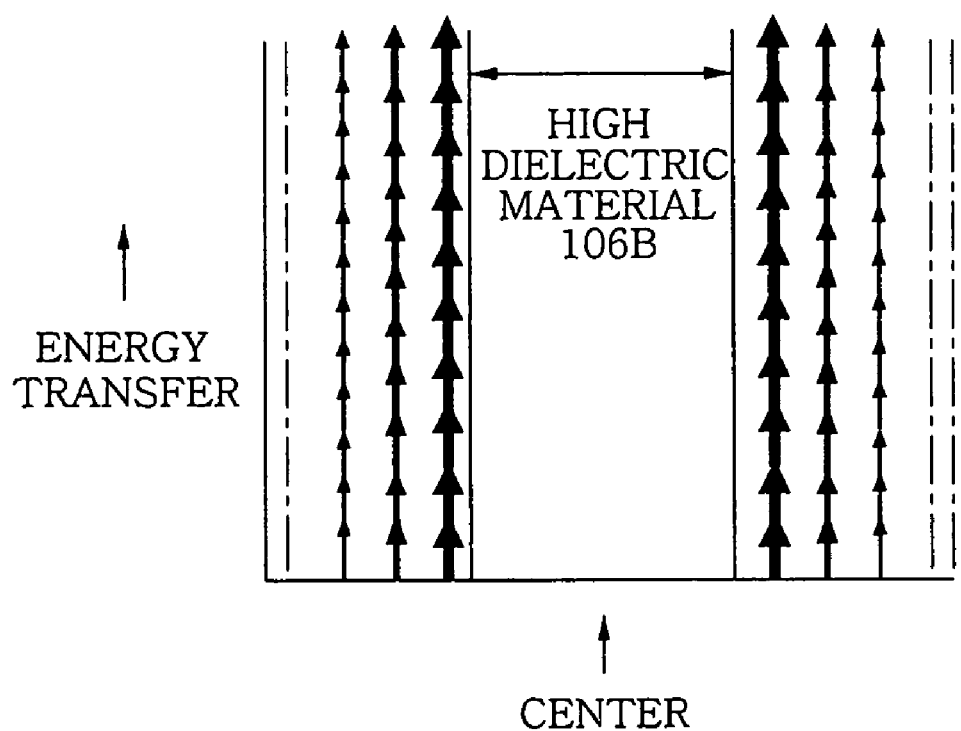

FIG. 4 shows a model of a high dielectric waveguide used in the simulation. FIG. 5A shows an electric field strength distribution; FIG. 5B shows a magnetic field strength distribution; and FIG. 5C illustrates a pointing vector showing an energy transfer.

In the high dielectric waveguide 94 of the model shown in FIG. 4, a waveguide main body 104 with a circular ring-shaped cross section is entirely formed of a conductor material. Further, the guide axis 106 with a circular cross section, which is installed at the central portion of the high dielectric waveguide 94, has an upper and a lower portion 106A, 106A that are made of a conductor material and a central part 106B interposed (located) between the upper and the lower part 106A, 106A, the central part 106B being made of a high dielectric material having a relative dielectric constant $\in$ of 1000. Herein, the diameter D1 of the guide axis 106 is set to 4 mm, and the inner diameter D2 of the waveguide main body 104 is set to 10 mm. Further, there exists air in a space between the guide axis 106 and the waveguide main body 104.

Microwave of 2.45 GHz vibrating in the TEM mode was supplied into the high dielectric waveguide 94, and the reflectance ratio of an incident plane was measured to be 0.9%. Namely, it is confirmed that 99.1% of microwave was transmitted through the high dielectric waveguide 94, thereby preventing a propagation loss from occurring therein.

As for the distribution of electric field, as shown in FIG. 5A, the electric field increases from the waveguide main body 104 on the outer side toward the center in the form of a substantially quadratic curve, and reaches its maximum in the vicinity of the surface of the guide axis 106. Further, the electric field inside the guide axis 106 is very small, producing a small amount of electric field therein.

Moreover, as for a magnetic field distribution, a magnetic field is proved to be very small in the waveguide main body 104 and in the space between the waveguide main body 104 and the guide axis 106, while it is distributed with very large amplitudes within the guide axis 106 toward its center, as shown in FIG. 5B. Since, however, the electric field in the central axis is very small, pointing vectors representing an energy transfer becomes substantially 0 in the central axis as shown in FIG. 5C such that electromagnetic waves travels in the air. Also, in FIG. 5C, the larger the arrow, the greater the energy transfer.

Besides, FIG. 6 shows another model of a high dielectric waveguide utilized in the simulation. Here, the structure of a guide axis 106 located at its center is identical to that illustrated in FIG. 4. A waveguide main body 104 with a circular ring-shaped cross section of an outer side is configured to have an upper and a lower portion 104A, 104A that are made of a conductor material and a central part 104B interposed between the upper and the lower part 104A, 104A, the central part 104B being made of a high dielectric material. Here, each size of the guide axis 106 and the waveguide main body 104 is identical to that in FIG. 4. Besides, relative dielectric constants E of the high dielectric materials for the central portions 106B of the guide axis 106 and the central portions 104B of the waveguide main body 104, respectively, are all set to 1000.

Microwave of 2.45 GHz vibrating in the TEM mode was supplied, and, as a result, the reflectance ratio of an incident plane was measured to be 0.1%. That is, it is proved that 99.1% of the microwave was propagated through the high dielectric waveguide 94, thereby preventing a propagation loss from occurring therein.

Thus, it is proved that a transmission of microwave can be accomplished without incurring a propagation loss even in case the central guide axis 106 is entirely formed of a conductor material and the central part 104B of the outer waveguide main body 104 is formed of a high dielectric material.

Further, the same simulations as described above are conducted by using a high dielectric material having a relative dielectric constant ∈ of 5000, and the results also show that efficient transmission of microwave was achieved as in the above-described experiments.

The basis for the achievement of efficient transmission of the microwave by the high dielectric waveguide 94 is as follows. First, the microwave flows through a conductor as a conduction current by triggering a skin effect, whereas it flows through a high dielectric material as a displacement current. The displacement current is generated in proportion to time differentiation of the electric field. However, if an electric field is to be generated, an action for suppressing the generation of the electric field (making the electric field as 0) takes places in the high dielectric material having a great relative dielectric constant (see FIG. 5A), which thought to exhibit the same behavior as the current flow.

As described above, the high dielectric waveguide 94 can transmit the microwave sufficiently or efficiently without accompanying a considerable amount of transmission loss. Therefore, the high dielectric waveguide 94 can be employed instead of a coaxial waveguide conventionally employed to propagate microwave in a TEM mode, thereby improving heat resistance greatly.

Hereinafter, a second preferred embodiment of the present invention will be described.

Figure 7:
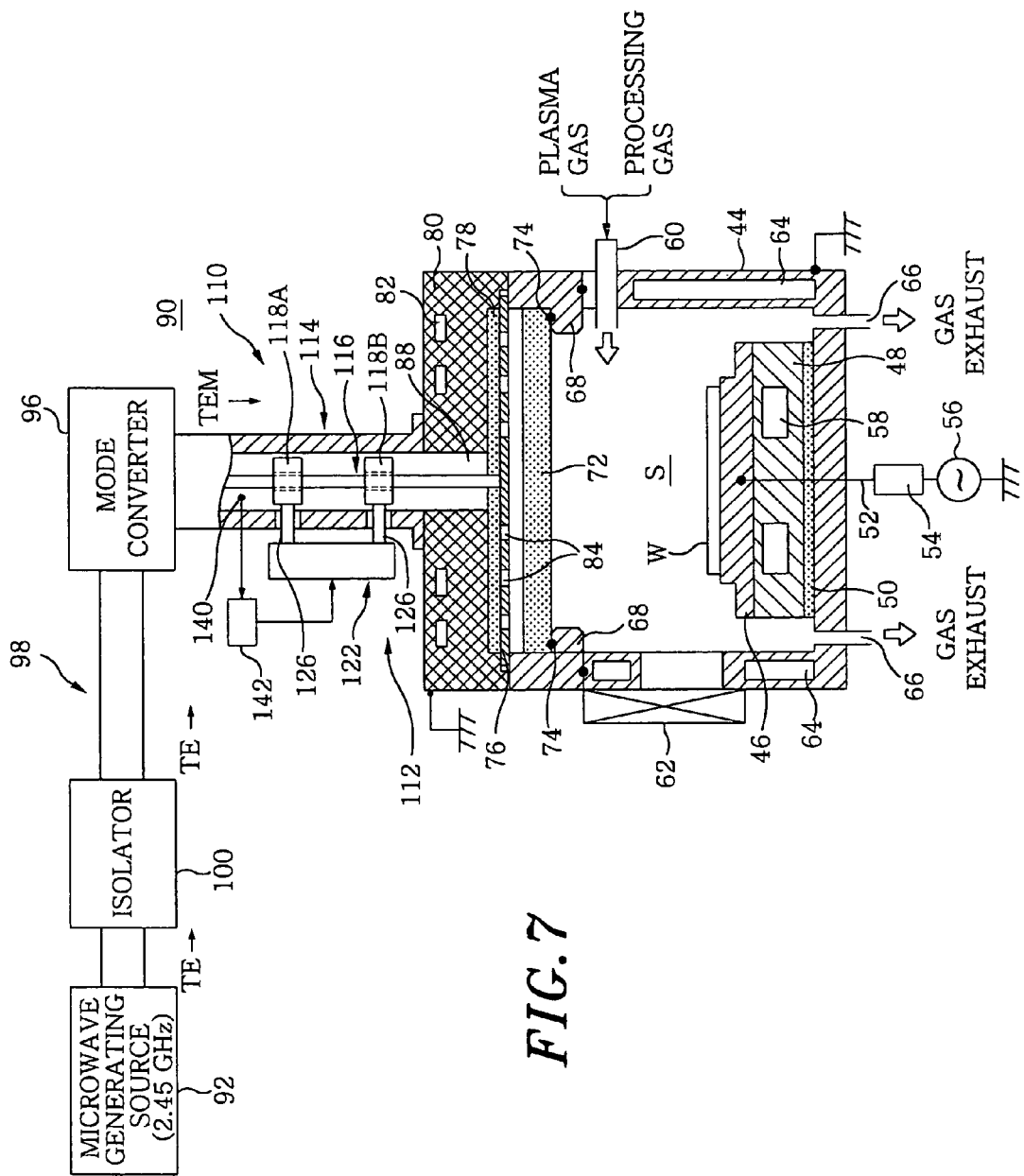
FIG. 7 illustrates a plasma processing apparatus in accordance with a second preferred embodiment of the present invention.
Figure 8:
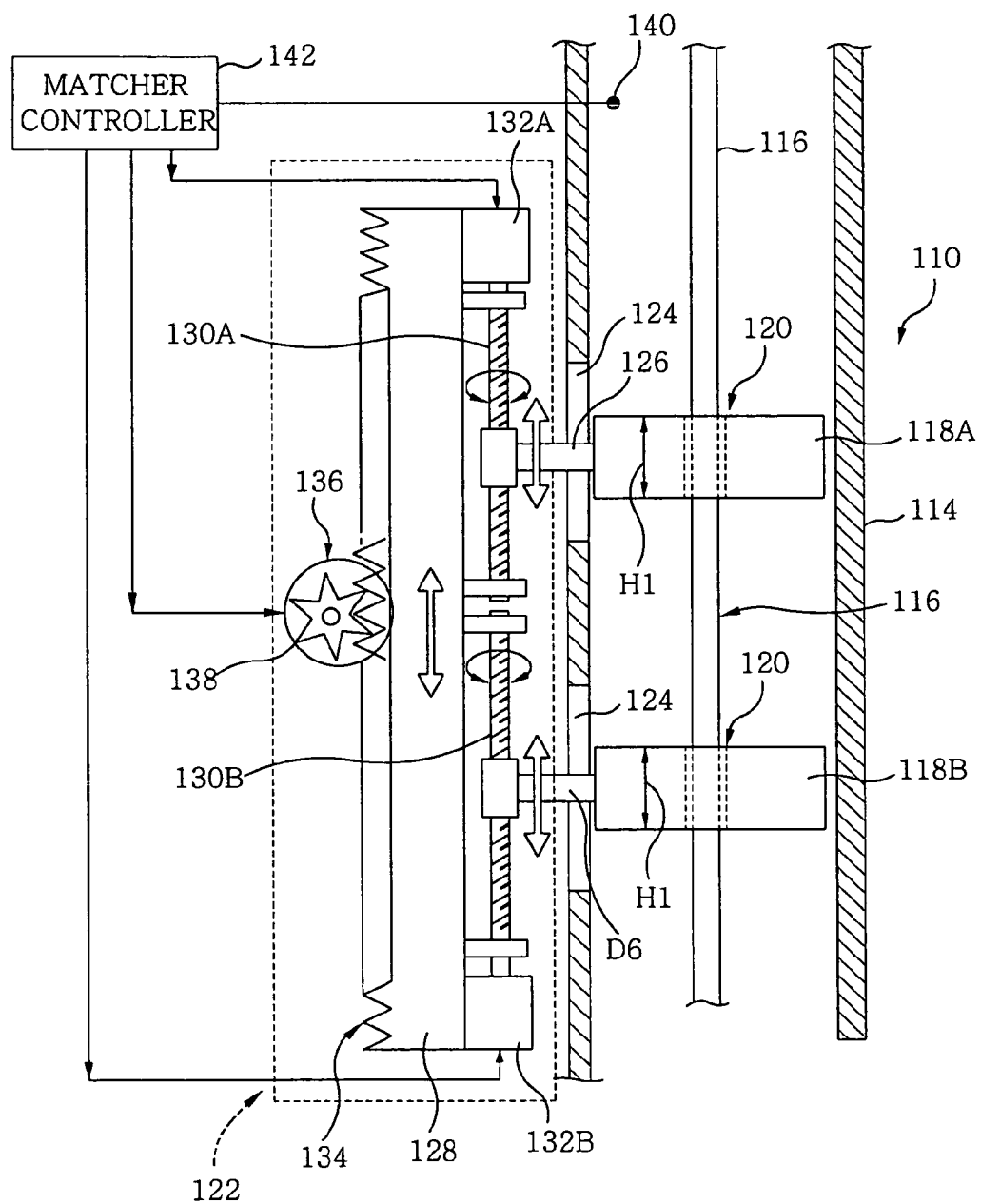
FIG. 8 shows a position controlling device used in a slug matcher.

Referring to FIG. 7, there is provided a plasma processing apparatus in accordance with the second preferred embodiment of the present invention. FIG. 8 shows a position control mechanism employed in a slug matcher.

Figure 11:
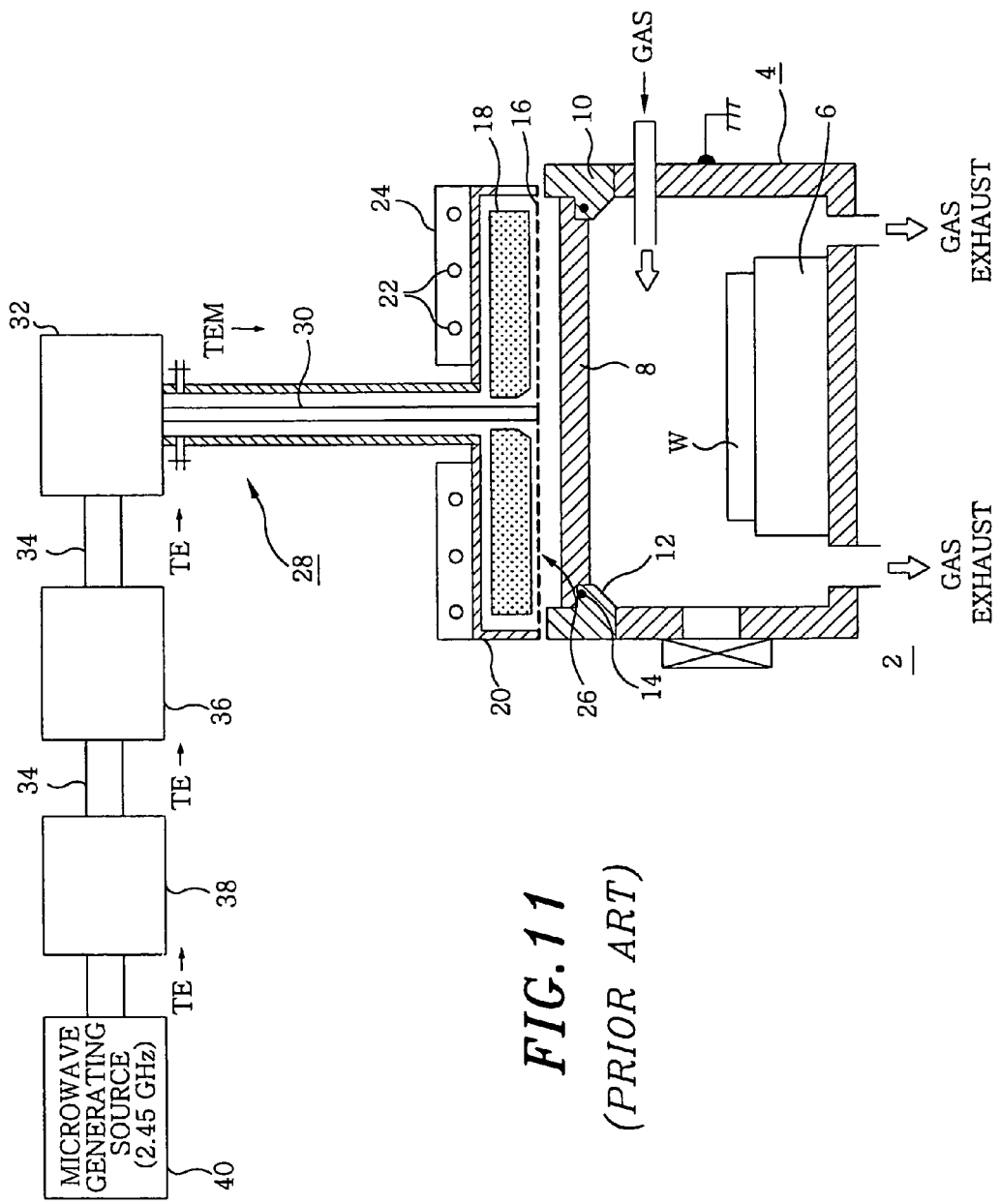
FIG. 11 shows a conventional plasma processing apparatus.

The characteristic of the second preferred embodiment resides in the fact that a slug matcher applied for the TEM mode is provided instead of a TE-mode matching circuit (the matching circuit 102 in FIG. 1 or the matching circuit 36 in FIG. 11) utilized in a conventional plasma processing apparatus.

The configuration of the processing container 44 in accordance with the second preferred embodiment is identical to that shown in FIG. 1. Therefore, parts that are identical to those described in FIG. 1 will be assigned identical reference numerals, and their discussions will be omitted.

The waveguide 90 of the second preferred embodiment is configured like the conventional apparatus. That is, a waveguide 90 includes a coaxial waveguide 110 with a circular cross section which is entirely made of a conductor material; and a rectangular waveguide 98 with a rectangular cross section, wherein the coaxial waveguide 110 is directly fixed to a central opening 88 of a shield cover body 80 in such a manner as to stand upright while the rectangular waveguide 98 is horizontally connected to an upper end portion of the coaxial waveguide 110 via a mode converter 96 for converting a vibration mode of the microwave. The rectangular waveguide 98 is identical to that shown in FIG. 1.

The rectangular waveguide 98 connecting the microwave generating source 92 and the mode converter 96 is entirely formed of a conductor material, e.g., brass whose surface is silver-plated, having a rectangular cross section. Only the isolator 100 for performing isolation against a reflected wave of the microwave is interposed at the rectangular waveguide 98, without the intervening the matching circuit 102 shown in FIG. 1. Instead of the matching circuit 102, a slug matcher 112, an inventive feature of the present invention, is installed at the coaxial waveguide 110. Specifically, the conventional well-known coaxial waveguide 110 allows the microwave in the TEM mode to travel therethrough, and includes a tube-shaped or pipe-shaped waveguide main body 114 with a substantially circular ring-shaped cross section and a bar-shaped guide axis 116 with a circular cross section, wherein the guide axis 116 is inserted through the central portion of the waveguide main body 114. Herein, both of the waveguide main body 114 and the guide axis 116 are made of a conductor material, e.g., brass whose surface is silver-plated, unlike in the first embodiment.

Further, the slug matcher 112 is provided at the coaxial waveguide 110 above and close to the flat antenna member 76. The slug matcher 112 includes two matching members 118A and 118B made of a dielectric material and provided in the waveguide main body 114 while being appropriately spaced apart from each other along a propagation direction of the microwave. Each of the matching members 118A and 118B is configured of a disc shape formed of a dielectric material containing Teflon (registered trademark) having a relative dielectric constant of about 2.6 with a predetermined thickness and a penetration hole 120 is formed at a central portion thereof. By inserting the guide axis 116 made of the conductor material through the penetration holes 120, the matching members 118A, 118B are configured to be movable.

Outer diameters of the matching members 118A and 118B are set to be slightly smaller than the inner diameter of the waveguide main body 114, and their thickness H1 is set to be, e.g., about λ/4 (λ: wavelength).

Besides, the matching members 118A, 118B can be moved either as a unit or individually along the propagation direction of the microwave by a position controlling device 122. To be specific, each of the matching members 118A and 118B is supported by support rods 126 inserted through two slits 124 provided in a sidewall of the waveguide main body 114. Base portions of the support rods 126 are screw-coupled to ball screws 130A and 130B rotatably supported on a base column 128. Moreover, by forwardly and backwardly rotating these ball screws 130A and 130B individually, the matching members 118A and 118B can be moved individually. Moreover, connected to end portions of the ball screws 130A and 130B are screw driving motors 132A and 132B, respectively. The ball screws 130A and 130B can be individually rotated forwardly and backwardly by using the screw driving motors 132A and 132B.

Further, a rack 134 is installed at one side of the base column 128, and a pinion 138 rotated by a rack driving motor 136 is thread fitted to the rack 134. By rotating the pinion 138 forwardly and backwardly, the base column 128 can be moved along a guide (not shown) in a vertical direction of FIG. 8 within a predetermined stroke.

In addition, provided in the waveguide main body 114 is a prober 140 for detecting the power and/or the phase of a reflection wave of microwave. A matcher controller 142 made up of, e.g., microcomputer, controls the rotational operations of the motors 132A, 132B and 136 based on an output from the prober 140.

In the plasma processing apparatus configured as described, the microwave generated from the microwave generating source 92 is transmitted as the TE mode within the rectangular waveguide 98. Then, the TE mode of the microwave is converted into the TEM mode by the mode converter 96, such that the microwave travels as the TEM mode within the coaxial waveguide 110 made of the conductor material with the circular ring-shaped cross section toward the flat antenna member 76.

Herein, the reflection wave of the microwave may be generated inside the waveguide 90 due to various factors such as the plasma state or the pressure state in the processing space S. However, the slug matcher 112 operates so as to minimize the reflection wave, thereby performing a so-called a matching function.

To be more specific, the power and/or the phase of the reflection wave of the microwave is detected by the prober 140 provided in the waveguide main body 114, and the controller 142 moves the matching members 118A and 118B as one body or individually by way of rotating the rack driving motor 136 and the screw driving motors 132A, 132B in order to remove the reflected wave, thereby obtaining a matching. For example, for the purpose of moving the matching members 118A and 118B as one body, it is preferable to move the base column 128 by rotating the rack driving motor 136, whereas it is preferable to rotate the screw driving motors 132A and 132B separately in order to move the matching members 118A and 118B individually.

Specifically, drawn on a Smith chart obtained by marking impedance and reflection coefficient for the microwave on a complex plane is a track in which, for example, the phase is changed by moving the matching members 118A and 118B as one body, and an imaginary part (reactance) is changed with a real part (resistance value) fixed by moving either one of the matching members 118A and 118B.

As described, the use of the TEM-mode slug matcher 112 may make the conventional TE mode matching unnecessary.

Further, since the slug matcher 112 is designed for the TEM mode as described, it can be installed directly above the flat antenna member 16 to be close thereto, thereby improving efficiency of impedance matching.

Herein, if a dielectric material having a greater relative dielectric constant is used as the dielectric material forming the matching members 118A and 118B, an adjustment range for impedance matching can be expanded by an increment of the relative dielectric constant. Besides Teflon (registered trademark), quartz, sapphire, SAPPHAL (registered trademark), and ceramics such as alumina and aluminum nitride can also be used as a high dielectric material.

Moreover, it is also preferable to install multiple stages, e.g., two stages, of slug matchers 112 along the coaxial waveguide 110.

Furthermore, though the second preferred embodiment has been described for the case of installing the slug matcher 112 in the conventional coaxial waveguide 110, the present invention is not limited thereto. That is, the slug matcher 112 can be installed in the apparatus in accordance with the first preferred embodiment of the present invention described in FIG. 1.

Figure 9:
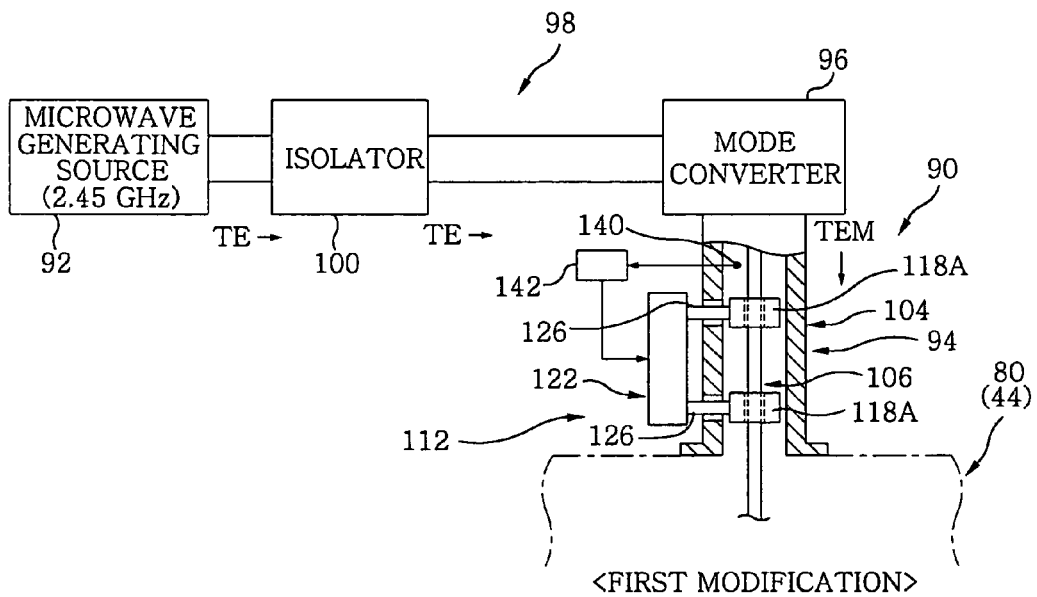
FIG. 9 illustrates a partially enlarged view of a first modification of the second embodiment.

FIG. 9 is a partial enlarged view describing a first modification of the second preferred embodiment.

As described in FIG. 1, a high dielectric waveguide 94 including a waveguide main body 104 and a guide axis 106 is disposed to allow a mode converter 96 and a flat antenna member 76 to communicate with each other. A slug matcher 112 having the same configuration as described in FIG. 7 is installed at the high dielectric waveguide 94. Further, in this case, the conventional matching circuit 102 (see FIG. 1) becomes unnecessary.

Under such configuration, the effects of the first preferred embodiment and the second preferred embodiment can be both obtained. That is, in addition to the effect of the first preferred embodiment for preventing the occurrence of, e.g., a leakage of microwave by way of increasing heat resistance of the high dielectric waveguide 94 to thereby reduce the amount of thermal distortion, the effect of the second preferred embodiment, i.e., improving the efficiency of impedance matching by rendering the conventional TE-mode matching circuit unnecessary, can also be obtained.

Besides, though the high dielectric waveguide 94 is only used to connect the mode converter 96 and the flat antenna member 76, it is not limited thereto and it can be used to connect the flat antenna member 76 and the microwave generating source 92 as well.

Figure 10:
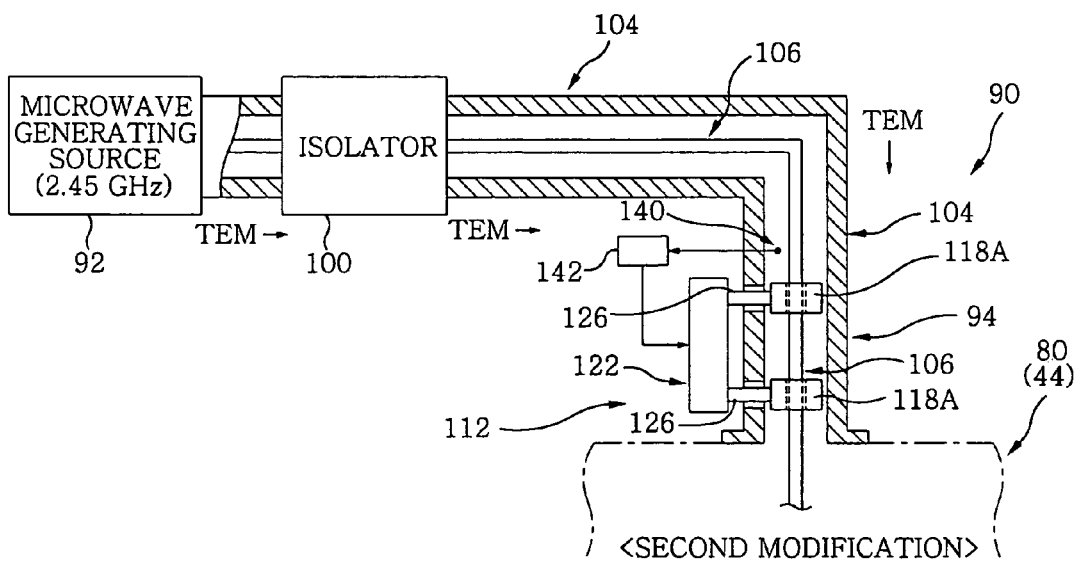
FIG. 10 illustrates a partial configuration view of a second modification of the second embodiment.

FIG. 10 is a partial configuration view showing a second modification of the second preferred embodiment of the present invention.

As shown therein, waveguides between a flat antenna member 76 and a microwave generating source 92 are formed entirely by a high dielectric waveguide 94 including a waveguide body 104 and a guide axis 106. Further, a slug matcher 112 is disposed at the high dielectric waveguide 94 to be located directly above the flat antenna member 76.

Under such configuration, microwave generated from the microwave generating source 92 travels as a TEM mode from the beginning, so that an installation of a mode converter 96 (see FIG. 9) becomes unnecessary. In addition, though the waveguide main body 104 in FIG. 10 is shown to be angled at 90°, it is also preferred to form the waveguide main body 104 straight without bending it so that it is angled because the mode converter 96 is not used here.

Accordingly, this second modification achieves the elimination of losses accompanied by a mode conversion while contributing to a cost cut of the apparatus by making the mode converter 96 unnecessary, thereby improving the transmission efficiency of microwave.

Moreover, by replacing the portion of the conductive rectangular waveguide 98 (see FIG. 1 or FIG. 10) with the high dielectric waveguide 94, a heat resistance of that portion can be improved with a reduced thermal distortion and a leakage of the microwave can be prevented.

Further, though the preferred embodiments have been descried for the case of performing a film forming process on a semiconductor wafer, it is not limited thereto, and the present invention can also be applied to other plasma processes such as plasma etching and plasma ashing. Moreover, a glass substrate, an LCD substrate or the like in addition to the semiconductor wafer can also be used as a to-be-processed object.

INDUSTRIAL APPLICABILITY

As described, the plasma processing apparatus in accordance with the present invention has advantageous effects as follows.

In accordance with the first preferred embodiment of the present invention, since a high dielectric waveguide made of a high dielectric material is employed, the linear expansion coefficient of the waveguide itself can be reduced smaller than that of a conventional waveguide, thereby reducing thermal distortion while improving its heat resistance. Accordingly, a deformation of the waveguide or a leakage of microwave can be prevented from occurring.

In accordance with the second preferred embodiment of the present invention, a slug matcher formed of a dielectric material is installed in an intermediate point of the waveguide, whereby a conventionally employed TE mode matching circuit becomes unnecessary.

Furthermore, since the TEM mode slug matcher can be disposed close to a flat antenna member, the efficiency of impedance matching can be improved.

Besides, since the microwave can be transmitted as the TEM mode from a microwave generating source, it becomes unnecessary to provide a mode converter on a travel path of the microwave, so that a cost saving can be achieved, and the mode conversion loss can be removed.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing equipment comprising:
   an evacuatable processing container;
   a loading table, installed in the processing container, for loading thereon an object to be processed;
   a microwave transmission plate provided in an opening of a ceiling of the processing container;
   a flat antenna member for supplying microwaves into the processing container via the microwave transmission plate;
   a grounded shield cover body covering an upper side of the flat antenna member; and
   a waveguide for supplying the microwaves from a microwave generating source to the flat antenna member,
   wherein at least a part of the waveguide comprises a coaxial waveguide including a tube-shaped waveguide main body of an outer side and a guide axis that penetrates a central portion of the waveguide main body, and
   wherein at least one of the waveguide main body and the guide axis includes, along its longitudinal axis, a high dielectric portion formed of a high dielectric material and a conductor portion formed of a conductor material such that the conductor portion and the high dielectric portion have the same diameter, and the high dielectric material has a relative dielectric constant of 100 or greater.

2. The equipment of claim 1, wherein a mode converter is interposed in the waveguide, and the coaxial waveguide is employed between the mode converter and the flat antenna member.

3. The equipment of claim 1, wherein the high dielectric material has a relative dielectric constant greater than or equal to 1000.

4. The equipment of claim 1, wherein the high dielectric material includes one or more materials selected from the group consisting of PZT (complex materials containing Pb, Zr, Ti and O), BST (complex materials containing Ba, Sr, Ti and O) and SBT (complex materials containing Sr, Bi, Ta and O).

5. The equipment of claim 1, wherein the flat antenna member is provided with microwave radiation holes formed of through holes arranged in a concentric or a spiral shape.

6. The equipment of claim 1, wherein the flat antenna member is provided with plural pairs of radiation holes formed in a concentric or a spiral shape, each pair of radiation holes being of two adjacent microwave radiation holes formed of through holes disposed in directions differing from each other by about 90 degrees.

7. The equipment of claim 1, wherein the waveguide is provided with a slug matcher using a dielectric material.

8. The equipment of claim 7, wherein the slug matcher is disposed close to the flat antenna member.

9. The equipment of claim 7, wherein the slug matcher includes two matching members which are made of a dielectric material and are appropriately spaced apart from each other along a propagation direction of the microwave, wherein the two matching members are capable of being moved as a unit.

10. The equipment of claim 9, wherein the two matching members are capable of being individually moved along the propagation direction of the microwave.

11. The equipment of claim 7, wherein the microwave is propagated in a vibration mode of a TEM mode from the microwave generating source.

12. The equipment of claim 7, wherein a mode converter is interposed in the waveguide, and the slug matcher is installed at a portion of the waveguide connecting the mode converter and the flat antenna member.

13. The equipment of claim 1, wherein there is a space between the guide axis and the tube-shaped waveguide main body through which the microwaves travel and the space is hollow and annular shaped.

14. The equipment of claim 13, wherein the space extends along the guide axis from a mode converter to a delay member disposed above the flat antenna member.

15. The equipment of claim 1, wherein the microwaves create an electric field of higher intensity in the space than inside the guide axis.

16. The equipment of claim 1, wherein the conductor portion includes a upper part and a lower part and the high dielectric portion is interposed between the upper and the lower part.

17. The equipment of claim 1, wherein the waveguide main body includes the high dielectric portion and the conductor portion, and the guide axis is entirely formed of the conductor material.

18. The equipment of claim 1, wherein the guide axis includes the high dielectric portion and the conductor portion, and the waveguide main body is entirely formed of the conductor material.

19. The equipment of claim 1, wherein each of the waveguide main body and the guide axis includes the high dielectric portion and the conductor portion.

* * * * *